(12) United States Patent
Ogawa et al.

(10) Patent No.: US 6,936,515 B1
(45) Date of Patent: Aug. 30, 2005

(54) METHOD FOR FABRICATING A MEMORY DEVICE HAVING REVERSE LDD

(75) Inventors: Hiroyuki Ogawa, Sunnyvale, CA (US); Yu Sun, Saratoga, CA (US); Angela Hui, Fremont, CA (US)

(73) Assignee: FASL LLP, Sunnyvale, CA (US)

( * ) Notice: Subject to any disclaimer, the term of this patent is extended or adjusted under 35 U.S.C. 154(b) by 0 days.

(21) Appl. No.: 10/387,774

(22) Filed: Mar. 12, 2003

(51) Int. Cl.[7] .............................................. H01L 21/336
(52) U.S. Cl. ..................................................... 438/266
(58) Field of Search ................................ 438/257–267, 438/233, 200, 199, 197, 275, 276, 279, 283; 257/314–320, 257/E29.129, E21.179, E21.422, E21.681, 257/E21.683, E21.686

(56) References Cited

U.S. PATENT DOCUMENTS

| | | | |
|---|---|---|---|
| 5,830,794 A * | 11/1998 | Kusunoki et al. .......... | 438/266 |
| 6,133,096 A * | 10/2000 | Su et al. ..................... | 438/264 |
| 6,238,977 B1 * | 5/2001 | Sung .......................... | 438/261 |
| RE37,959 E * | 1/2003 | Komori et al. ............. | 438/258 |
| 6,610,565 B2 * | 8/2003 | Kim et al. .................. | 438/233 |
| 2002/0173099 A1 * | 11/2002 | Chern et al. ................ | 438/257 |

\* cited by examiner

*Primary Examiner*—George Fourson
*Assistant Examiner*—Brook Kebede

(57) ABSTRACT

A method for fabricating a semiconductor device. Specifically, a method that includes forming a source and drain region in a periphery transistor, exhibiting a channel width between the source and drain regions suitable for operation at predetermined voltages. After forming the source and drain regions, to eliminate diffusion of lightly doped drain regions resulting from a later formation of the source and drain regions, forming the lightly doped drain regions adjacent to the source and drain regions of the periphery transistor. After forming the lightly doped drain regions in the periphery transistor, the method includes forming a source region and a drain region in a core memory cell, independent of forming the source and drain regions in the periphery transistor.

16 Claims, 11 Drawing Sheets

METHOD FOR FABRICATING A MEMORY DEVICE HAVING REVERSE LDD

TECHNICAL FIELD

The present invention relates to the field of semiconductor memory device fabrication. Specifically, embodiments of the present invention relate to changing the method of depositing the layers of the memory device to allow for thinner side-wall spacers without current breakdown and to reduce shortening of channel width.

BACKGROUND ART

Flash memory, which is sometimes called "flash ROM", is a type of non-volatile memory that can be erased and reprogrammed in units of memory called blocks. It is a variation of electrically erasable programmable read-only memory which, unlike flash memory, is erased and rewritten at the byte level, which is slower than flash memory updating. Flash memory is used in digital cellular phones, digital cameras, LAN switches, PC Cards for notebook computers, digital set-up boxes, embedded controllers, and other devices.

Flash memory gets its name from the organization of the microchip, which allows a section of the memory cells to be erased in a single action or "flash". Flash memory uses higher voltages than most other types of memory cells. A conventional semiconductor memory device containing flash memory cells at the core of the device also contains periphery transistors that can handle and supply the higher voltage needed for the core flash memory cells. The periphery transistors have a lightly doped drain (LDD) region implanted in the substrate and then a sidewall is formed and a higher doped source/drain region is formed behind the LDD in order to handle the higher voltages needed. As the dosage in the higher dose source/drain region becomes higher, a wider spacer is needed. A wider spacer impacts the size requirements for the ever-decreasing semiconductor device configuration.

Prior Art FIG. 1A illustrates the basic configuration of a conventional periphery transistor 100a with a design channel length 170 and effective channel length 175. Substrate 105 contains a grown layer of gate oxide 130 and a layer comprising a polysilicon floating gate 110. After an LDD region 140 is implanted into substrate 105, a sidewall spacer 120 is deposited and a higher doped source/drain region 150 is implanted. When voltage is applied, current 160 flows from source to drain.

Prior Art FIG. 1B Illustrates a conventional periphery transistor 100b with a design channel length 170 and an effective channel length 185 in which the higher doped source/drain region 150 is diffused past the LDD 140 region and under the gate 110 area. When high voltage is applied in this instance, current 160 may flow through substrate 105 rather than flowing from source to drain. The memory cell 100b thus may become inoperable. This malfunction is referred to as a current breakdown.

Another problem that may occur when the source/drain region 150 diffuses under the gate 110 area is known as short channel effect. Design channel length 170 is measured from one edge of polysilicon gate 110 to the other, but effective channel length 175 of Prior Art FIGS. 1A and 185 of Prior Art FIG. 1B is approximately the distance from one inner edge of the LDD 140 and/or source/drain region 150 to the other inner edge, whichever is shortest. Threshold voltage is a function of effective channel length as shown in Prior Art FIG. 2A. If effective channel length varies substantially from design channel length, the threshold voltage may be out of specification, causing a malfunction of the transistor. For example, if the design threshold voltage is between lower limit 210 and upper limit 220 of FIG. 2A, it is possible that transistor 100a of FIG. 1A would perform optimally at point 215 on curve 200a. However, if source/drain 150 were diffused under LDD 140 as shown in FIG. 1B, the threshold voltage may drop to point 205 on curve 200a of FIG. 2A. This could put the threshold out of spec and cause a malfunction of transistor 100b.

As the state-of-the-art semiconductor devices become increasingly smaller, the conventional process for forming the silicon nitride layer that forms a common source area coupled to a source region of a transistor and the sidewalls at the drain region may become inadequate. Presently, the source and drain regions of periphery transistors are formed simultaneously with the source and drain of the aforementioned core memory cell. Requirements for sidewall spacer width at the periphery transistors may begin to impact the formation of a contact at the drain region of the core memory cell as the semiconductor devices decrease in size.

Thus, what is needed is a method for fabricating a semiconductor device that allows for adequate space at the core memory cell drain to form a contact and that reduces diffusion of the source and drain regions and shortening of channel length, thereby reducing malfunctions and improving performance in periphery transistors and core flash memory cells of the conventional semiconductor devices.

DISCLOSURE OF INVENTION

The present invention provides a method for fabricating a semiconductor device that allows for adequate space at the core memory cell drain to form a contact and that reduces diffusion of the source and drain regions and shortening of channel length, thereby reducing malfunctions and improving performance in periphery transistors and core flash memory cells of the conventional semiconductor devices.

In various embodiments, the present invention presents a method for fabricating a semiconductor device. In one embodiment the method includes forming a source drain region in a periphery transistor, exhibiting a channel width between the source and drain regions suitable for operation at voltages greater than 10 volts. To eliminate diffusion of lightly doped drain regions resulting from a later formation of the source and drain regions, the lightly doped drain regions adjacent to the source and drain regions of the periphery transistor are formed after forming the source and drain regions of the periphery transistors. According to one embodiment, after forming the lightly doped drain regions in the periphery transistor, the method includes forming a source region and a drain region in a core memory cell, independent of forming the source and drain regions in the periphery transistor. The purpose of forming the core memory cell source and drain after the periphery transistor source and drain and lightly doped drain is to isolate the formation of a drain contact to the drain region of the core memory cell from the formation of the source and drain regions of the periphery transistor.

In one embodiment, prior to the formation of the source and drain in the periphery transistor, a silicon oxide liner is deposited over the periphery transistor that includes a gate oxide layer formed on a semiconductor substrate between the source and drain regions of the periphery transistor, and a polysilicon layer that is disposed on top of the gate oxide layer. A silicon nitride layer is then disposed on top of the silicon oxide liner and the silicon nitride layer is etched to form a first sidewall spacer wide enough to form the desired channel width between the periphery transistor source and drain regions.

In one embodiment, the method for fabricating a semiconductor device includes depositing a silicon oxide liner over the periphery transistor, on top of which is deposited a layer of silicon nitride, thus forming a two-layer liner. A silicon oxide layer is then disposed on top of the two-layer liner and the silicon oxide layer is etched to form a first sidewall spacer with sufficient width to form a channel width between the periphery transistor source and drain regions. In this embodiment the first sidewall spacer would be removed following the formation of the periphery transistor source and drain regions.

Other features and advantages of the invention will become apparent to those of ordinary skill in the art after having read the following detailed description of the preferred embodiments taken in conjunction with the accompanying drawings, illustrating by way of example the principles of the invention.

BRIEF DESCRIPTION OF DRAWINGS

The accompanying drawings, which are incorporated in and form a part of this specification, illustrate embodiments of the invention and, together with the description, serve to explain the principles of the present invention.

Prior Art

Prior Art

Prior Art

The drawings referred to in this description should not be understood as being drawn to scale except if specifically noted.

MODE(S) FOR CARRYING OUT THE INVENTION

Reference will now be made in detail to the preferred embodiments of the present invention, a reverse LDD method for fabricating a memory device. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, an embodiment of the present invention is disclosed as a method for fabricating a semiconductor device that allows for isolating the formation of a drain contact in core memory cells from the formation of source and drain regions in periphery transistors formed on the same substrate.

Figure 1A:
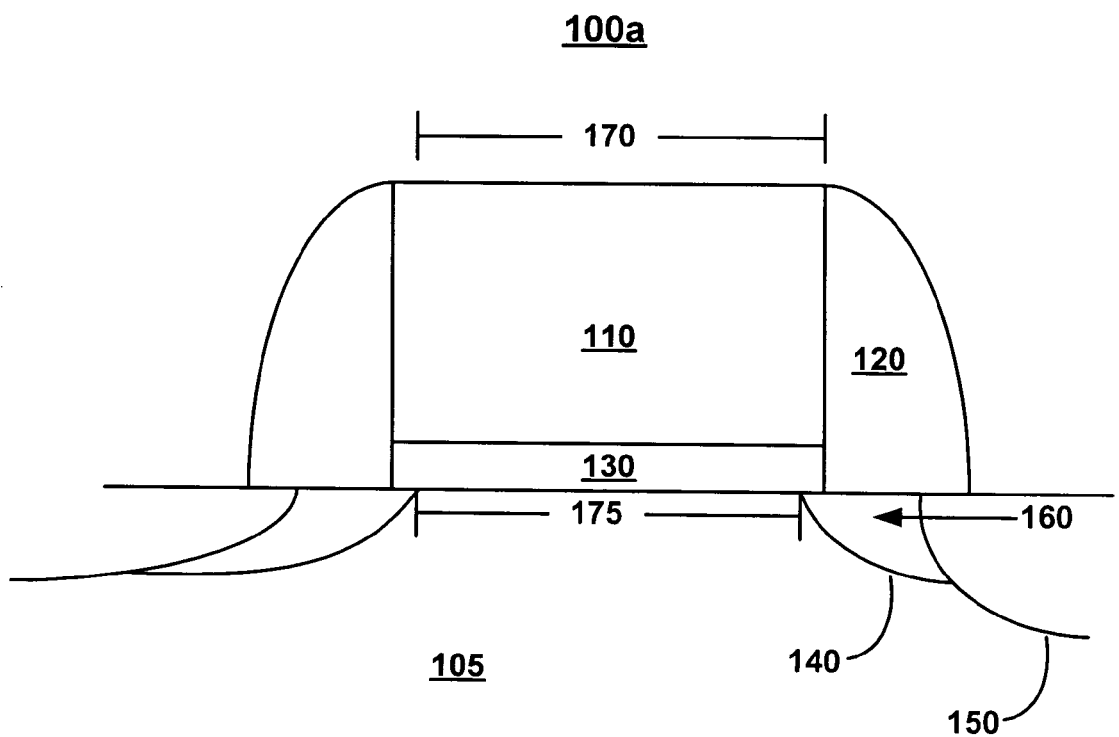
FIG. 1A illustrates a conventional periphery transistor.
Figure 1B:
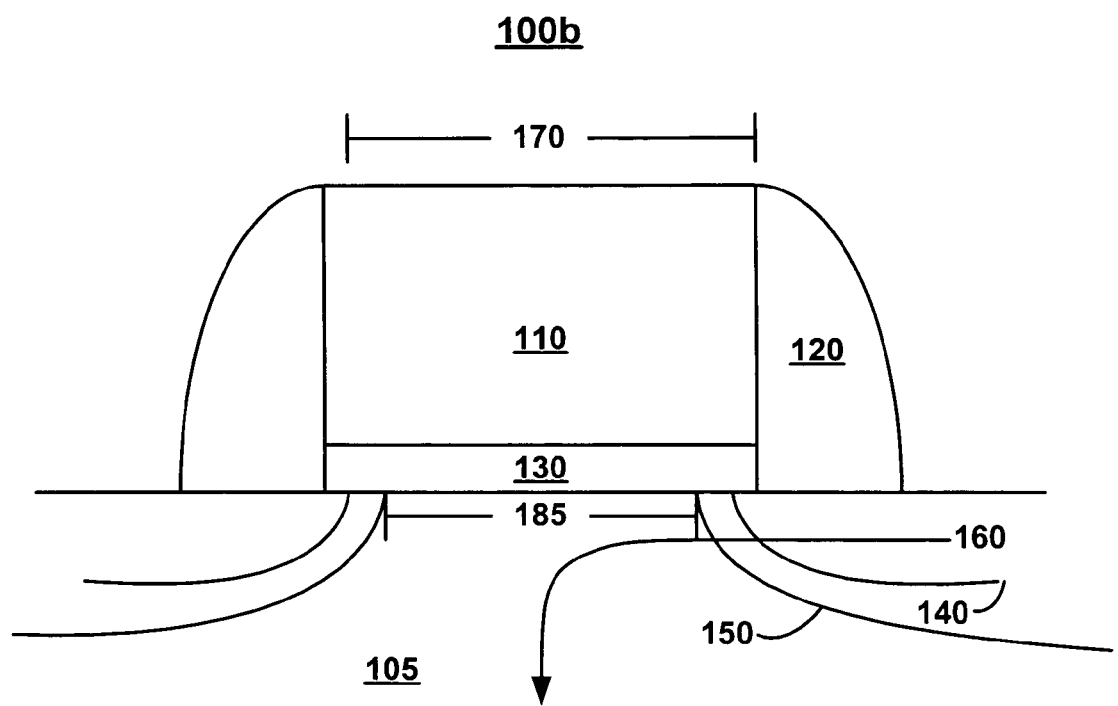
FIG. 1B illustrates a periphery transistor with source and drain regions diffused under the lightly doped drain region.
Figure 2:
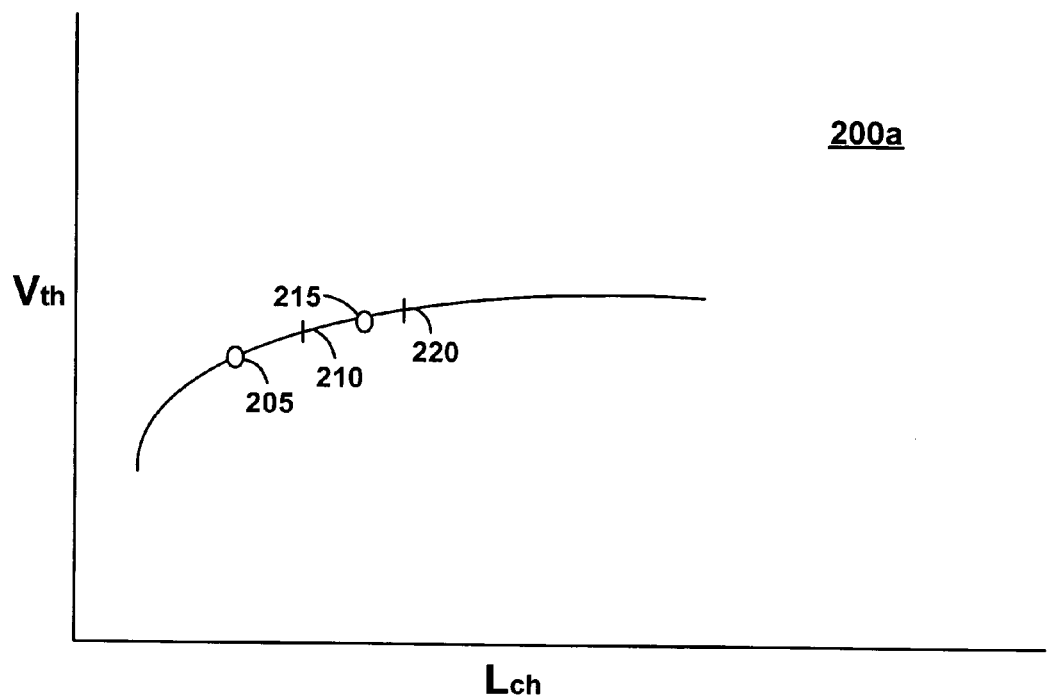
FIG. 2 illustrates the relationship between channel length and threshold voltage.
Figure 3A:
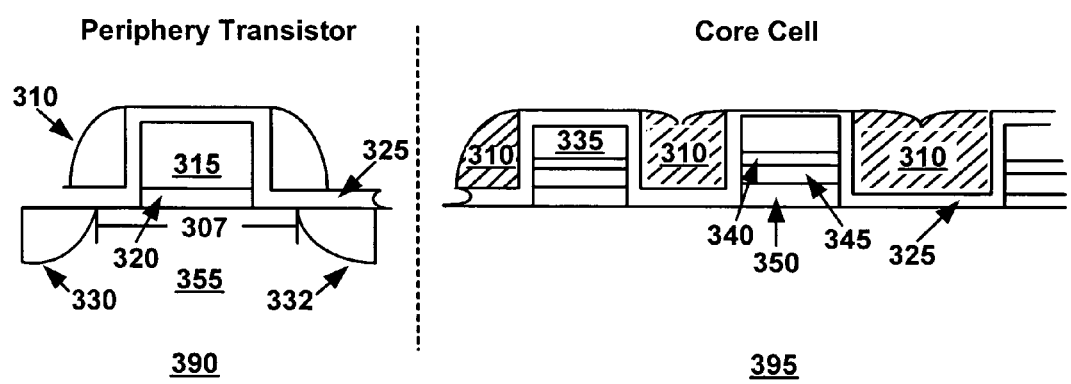
FIG. 3A illustrates a step in the fabrication of a semiconductor device in accordance with one embodiment of the present invention, showing the formation of a source and drain region at a periphery transistor.

FIG. 3A illustrates a state 300a in the fabrication of semiconductor device 300c in accordance with one embodiment of the present invention. Specifically, FIG. 3A shows the doping of a source region 332 and drain region 330 (a first source and drain region) at a periphery transistor 390 by the present embodiment. The present embodiment forms the source region 332 and drain region 330 prior to forming a lightly doped drain region at periphery transistor 390 and prior to forming source and drain regions (a second source and drain) in core memory cells 395. In the present embodiment, periphery transistor 390 comprises a tunnel oxide layer 320 formed on a semiconductor substrate 355, a polysilicon gate 315, and a silicon oxide liner 325. Further, the periphery transistor 390 is coated with a silicon nitride layer to form sidewall spacers 310 at the periphery transistor 390 that have a width appropriate for performing an n+/p+ implant to form source 332 and drain 330 regions. The appropriate width for sidewall spacers 310 is that which may afford a channel width 307 suitable for operation at voltages greater than 10 volts.

At the same time, core memory cells 395 receive the same coating layer 310 of silicon nitride. According to one embodiment, core memory cells 395 are flash memory cells. Flash memory cells are composed of a tunnel oxide layer 350 formed on substrate 355, a floating gate 345 formed on the tunnel oxide layer 350. A multi-level (e.g., ONO) insulating layer 340 is formed on the floating gate 345 and a control gate 335 formed on insulating layer 340. The n+/p+ implant is then performed to form source and drain regions 330.

Figure 3B:
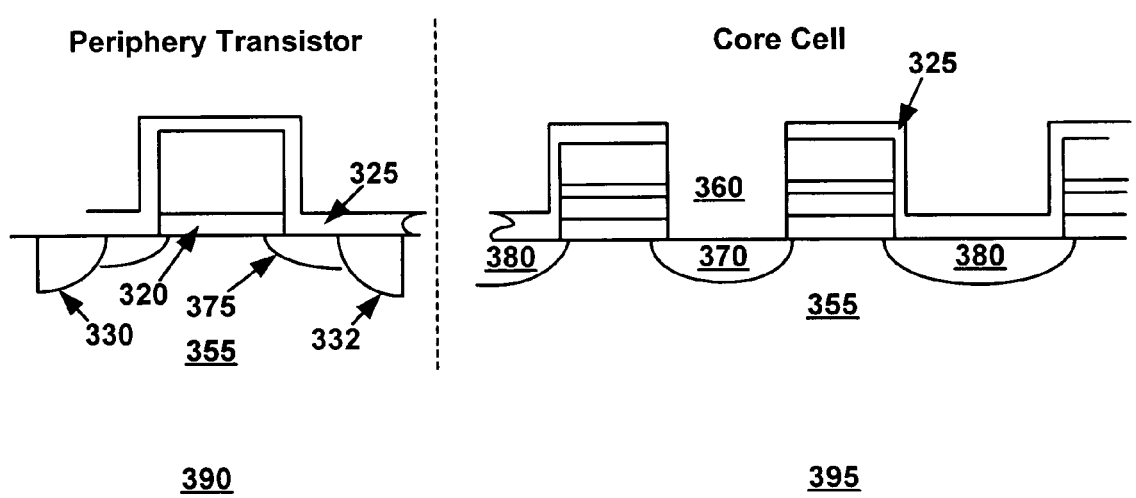
FIG. 3B illustrates a step in the fabrication of a semiconductor device in accordance with one embodiment of the present invention, showing the formation of lightly doped drain region in a periphery transistor and a source and drain region in a core memory cell.

FIG. 3B illustrates a further state 300b in the fabrication of semiconductor device 300c, in accordance with one embodiment of the present invention, showing the formation of lightly doped drain regions 375 in a periphery transistor and a source 370 and drain 380 region in a core memory cell 395. According to one embodiment, the silicon nitride layer forms sidewall spacer 310 and fills regions between core memory cells 395. The silicon nitride layer 310 is then removed. The removal of the silicon nitride layer 310 enables the formation of a lightly doped drain region 375 at the periphery transistor and of an n+/p+ source 370 and drain 380 at the core memory cells.

Figure 3C:
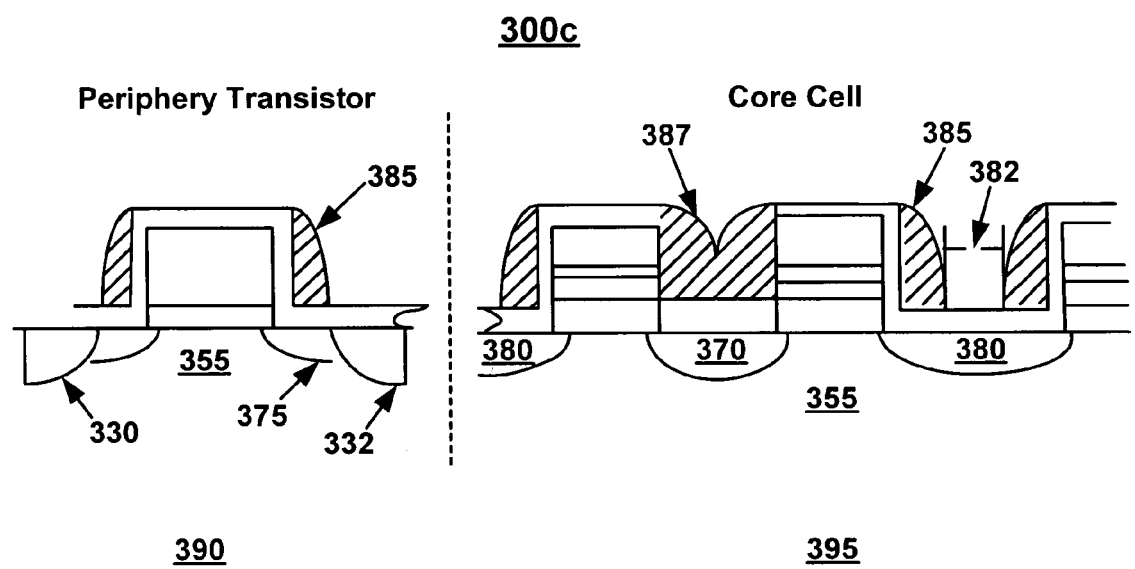
FIG. 3C illustrates a semiconductor device in accordance with one embodiment of the present invention, showing the formed sidewall spacers, common source and contact areas.

FIG. 3C illustrates a semiconductor device in accordance with one embodiment of the present invention, showing the formation of sidewall spacers 385, a common source area 387 and a contact area 382. Having formed the source 332 and drain 330 regions in the periphery transistors prior to the formation of the source 370 and drain 380 at the core memory cells, the need for forming a wide sidewall spacer at the periphery transistor 390 has been satisfied and a layer of silicon nitride is deposited to form sidewall spacers 385 and common source 387, sized to fill common source 387 and leave an adequate space 382 to form a contact at drain 380 area. Thus, the process of forming a contact at drain 380 area has been isolated from the formation of the periphery transistor source and drain 330.

Figure 4:
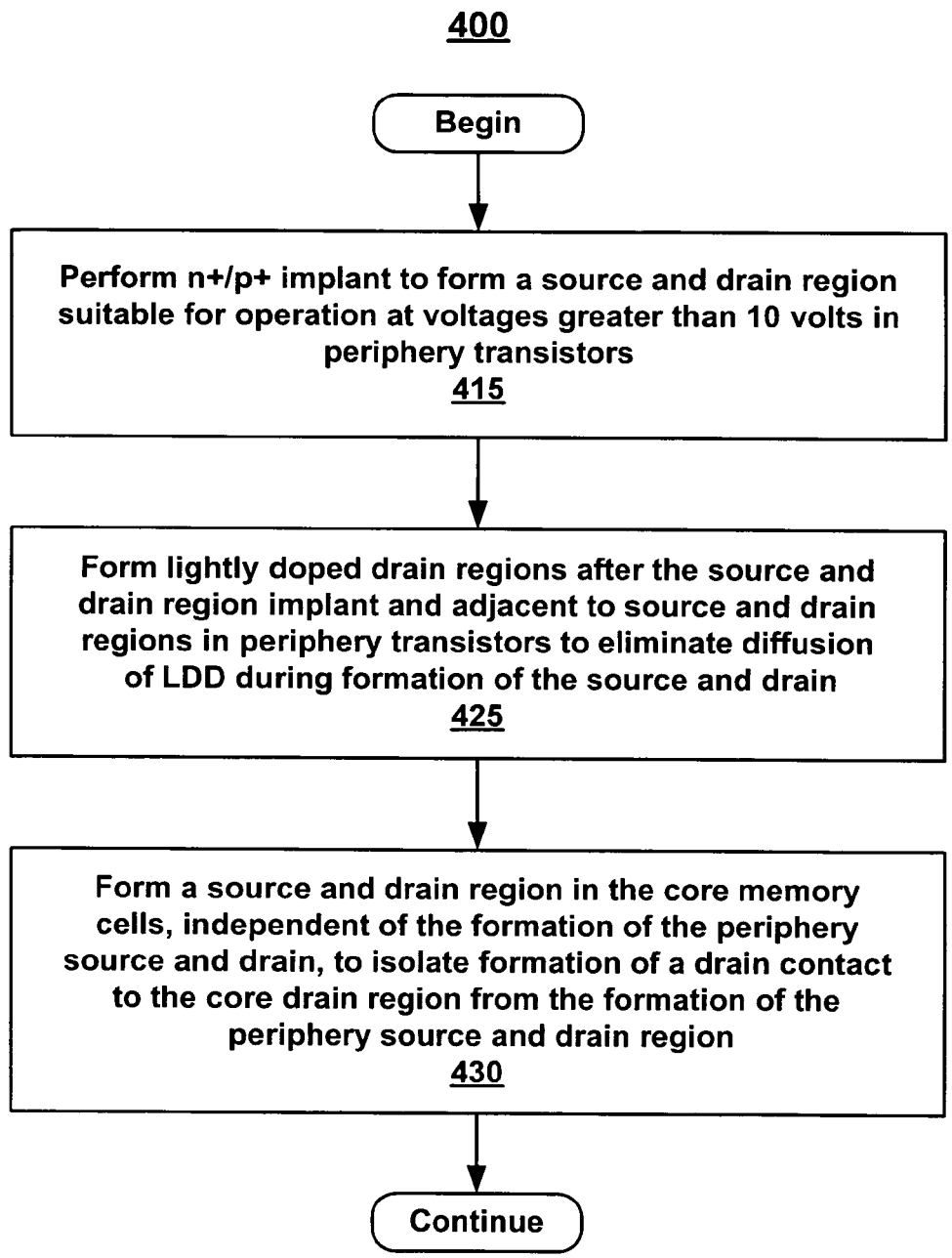
FIG. 4 is a flow diagram, in accordance with one embodiment of the present invention, of a method for fabricating semiconductor device.

FIG. 4 is a flow diagram of the steps performed in a method 400 for fabricating a semiconductor device, in accordance with one embodiment of the present invention. FIGS. 3A, 3B and 3C will be referenced for illustrations in the discussion that follows with respect to FIG. 4. As shown in step 415, an n+/p+ implant is performed to form a source 332 and drain 330 at the location of periphery transistors 390 suitable for operation at voltages greater than 10 volts. Due to the need for higher voltages, a highly doped implant is used. In order to perform the highly doped n+/p+ implant, a wide sidewall spacer 310 is formed to avoid diffusion of the n+/p+ implant under the polysilicon gate region 315. This spacer is formed by first depositing a silicon oxide (SiO) liner 325 across the periphery transistors 390 and core memory cells 395 formed on substrate 355. A layer 310 of silicon nitride (SiN) is then deposited across the liner and etched back to the silicon oxide liner to form a sidewall spacer 310 of appropriate width. Appropriate width for the Silicon nitride spacer is one that allows for the implants to exhibit a channel width 307 that is suitable for operation at voltages in excess of 10 volts.

Still referring to FIG. 4 in conjunction with FIGS. 3A–C, once the sidewall spacers are formed, the periphery transistor source and drain regions are implanted and a rapid thermal anneal (RTA) cycle is performed in order to activate the implants, in one embodiment. By implanting the source and drain at the periphery transistors prior to and independent of implanting the lightly doped drain (LDD) regions 375 and the core memory cell source 370 and drain 380 regions, the present embodiment achieves two advantages. First, the periphery transistor sidewall spacers 310 may be sized without concern for how they might impact the formation of common source regions 387 and drain contact regions 382 at the core memory cells. Second, the later formation of the LDD and the core memory cell source and drain removes them from the RTA cycle associated with the periphery transistor source and drain implants. The advantage of experiencing fewer RTA cycles is that excessive thermal exposure, which could result in diffusion of the source 370 and drain 380 regions of the core memory cells 395 under the polysilicon gate region, is avoided. By avoiding this possible diffusion, current breakdown and/or short channel effects that could result in a change in threshold voltages and the semiconductor devices not meeting specification requirements are thus avoided.

In step 425 of FIG. 4, lightly doped drain (LDD) regions 375 are formed adjacent to the source and drain regions in the periphery transistors 390. A purpose of the LDD regions is to eliminate the diffusion of the highly doped source 332 and drain 330 under the polysilicon gate 315 of the periphery transistors, thus avoiding current breakdown and short channel effects. In order to deposit the LDD implants after depositing the source and drain, the sidewall spacers 310 need to be removed. The removal of sidewall spacers 310 also results in the removal of all or almost all of the Silicon nitride layer 310 and the silicon oxide liner at the common source area above source region 370 across the core memory cells. Once the Silicon nitride is etched back, the LDD regions are implanted and an RTA cycle is once again performed to activate the LDD implants.

At step 430 a source 370 region and drain 380 region are implanted at the core memory cells 395, followed by another RTA cycle to activate the implantation. A layer 385 of silicon nitride or other applicable material is deposited to form sidewall spacers 385. Deposition of layer 385 allows for space 382 to form a drain contact at the drain region 380 of core memory cells 395 and to fill the common source (Vss) region 387. Thus, the core memory cell source and drain regions may be fabricated so as to form appropriate drain contact areas independent of the formation of wide sidewall spacers at the periphery transistors. In so doing, the breakdown voltage level, or voltage at which current breakdown occurs, may be maintained in the periphery transistors.

Figure 5A:
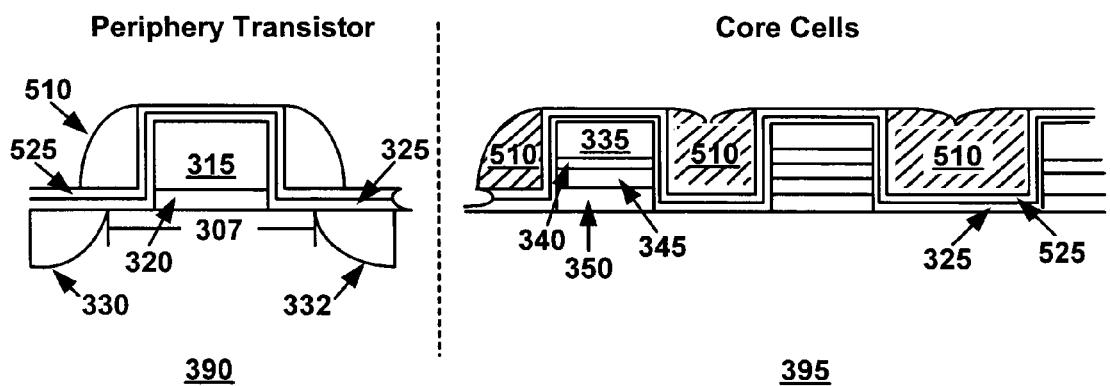
FIG. 5A illustrates a step in the fabrication of a semiconductor device in accordance with one embodiment of the present invention, showing the formation of a source and drain region at a periphery transistor.

FIG. 5A illustrates a state 500a in the fabrication of semiconductor device 500c in accordance with one embodiment of the present invention. Specifically, FIG. 5A shows the doping of a source 332 and drain 330 region (a first source and drain region) at a periphery transistor 390. According to one embodiment, fabrication of this state is performed prior to forming a lightly doped drain region at periphery transistor 390 and prior to forming a source and drain (a second source and drain) at the core memory cells 395. In the present embodiment, periphery transistor 390 comprises a tunnel oxide layer 320 formed on a semiconductor substrate 355, a polysilicon gate 315 coupled to the tunnel oxide layer 320, and a liner composed of a layer of silicon oxide (SiO) 325 on which a layer of silicon nitride 525 is deposited to form a two-layer liner.

The present embodiment then deposits a silicon oxide layer over the surface of liner 525 that forms sidewall spacers 510 at the periphery transistor that have a width appropriate for performing an n+/p+ implant to form source 332 and drain 330 regions. The appropriate width for sidewall spacers 510 is that which may afford a channel width 307 suitable for operation at higher voltages, e.g., greater than 10 volts. At the same time, core memory cells 395 receive the same coating layer 310 of silicon nitride.

According to one embodiment, core memory cells 395 are flash memory cells. Flash memory cells are composed of a tunnel oxide layer 350 formed on substrate 355, a floating gate 345 formed on the tunnel oxide layer 350. A multi-level (e.g., ONO) insulating layer 340 is formed on the floating gate 345 and a control gate 335 formed on insulating layer 340. The n+/p+implant is then performed to form source 332 and drain 330 regions.

Figure 5B:
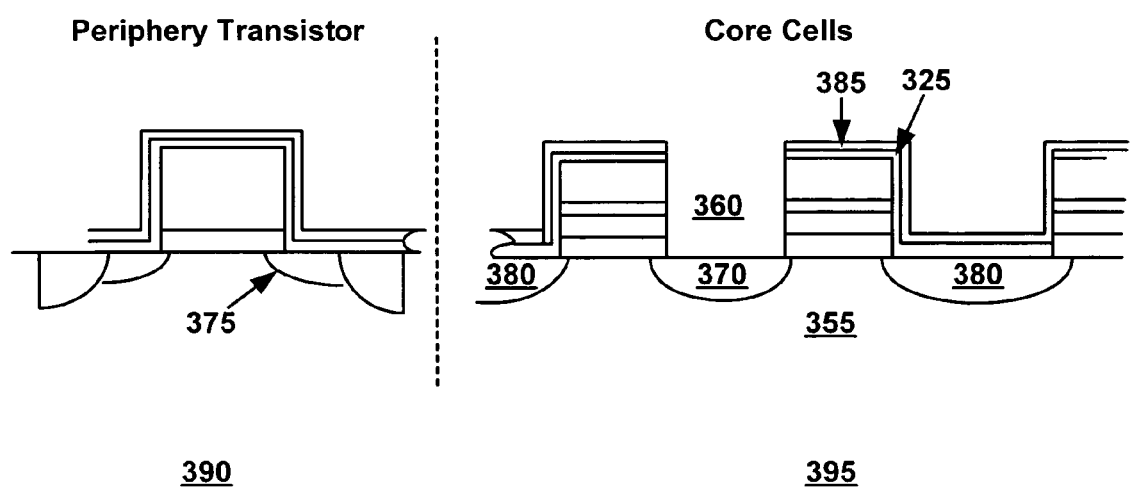
FIG. 5B illustrates a step in the fabrication of a semiconductor device in accordance with one embodiment of the present invention, showing the formation of lightly doped drain region in a periphery transistor and a source and drain region in a core memory cell.

FIG. 5B illustrates a further state 500b in the fabrication of a semiconductor device in accordance with one embodiment of the present invention, showing the formation of lightly doped drain regions 375 in a periphery transistor and a source 370 and drain 380 region in a core memory cell 395. According to one embodiment, the silicon oxide layer 510 forms sidewall spacer 510 at the periphery transistor 390 and fills regions between core memory cells 395. The silicon oxide layer 510 is then removed to expose the silicon nitride layer 525 of the two-layer liner, or, as at the source side of the core memory cells, the substrate 355. The removal of the silicon oxide layer 510 enables the formation of a lightly dosed drain region 375 at the periphery transistor and of an n+/p+ source 370 and drain 380 at the core memory cells.

One advantage of the present embodiment lies in the concept that silicon oxide may be more readily removed than Silicon nitride. In addition, should the removal of the silicon oxide impact the top Silicon nitride layer 525 of the two-layer liner, it will have little effect since the next step of the fabrication process, shown in FIG. 5C, deposits a layer of the same Silicon nitride material.

Figure 5C:
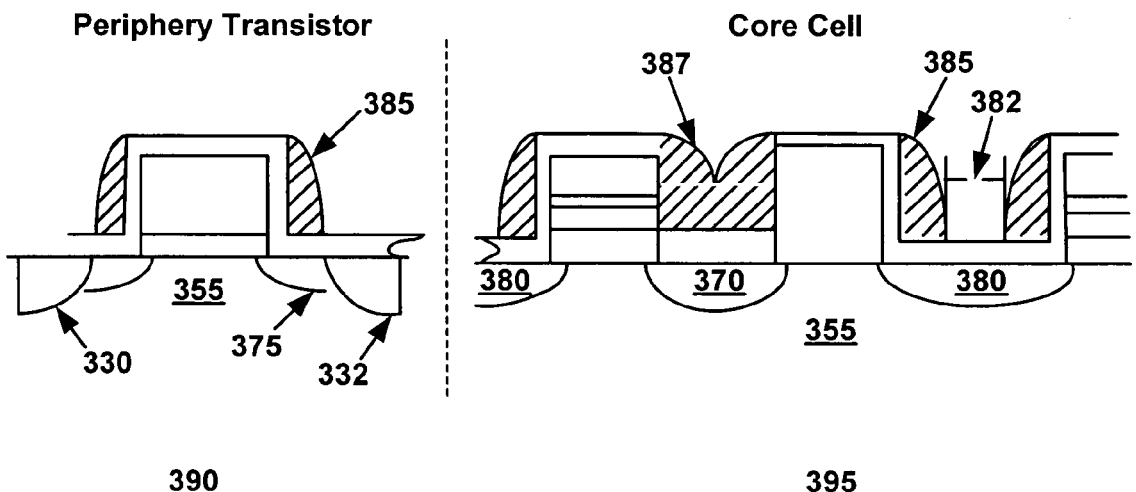
FIG. 5C illustrates a semiconductor device in accordance with one embodiment of the present invention, showing the formed sidewall spacers, common source and contact areas.

FIG. 5C illustrates a semiconductor device in accordance with one embodiment of the present invention, showing the formation of sidewall spacers 385, common source 387 and contact area 382 in a state 500c of the semiconductor device 400c during its fabrication. Having formed the source 332 and drain 330 regions in the periphery transistors prior to the formation of the source 370 and drain 380 at the core memory cells, the need for forming a wide sidewall spacer at the periphery transistor 390 has been satisfied and a layer of silicon nitride is deposited to form sidewall spacers 385 and common drain 387, sized to fill common source 387 and leave an adequate space 382 to form a contact at drain 380 area. Thus, the process of forming a contact at drain 380 area has been isolated from the formation of the periphery transistor source 332 and drain 330.

Figure 6:
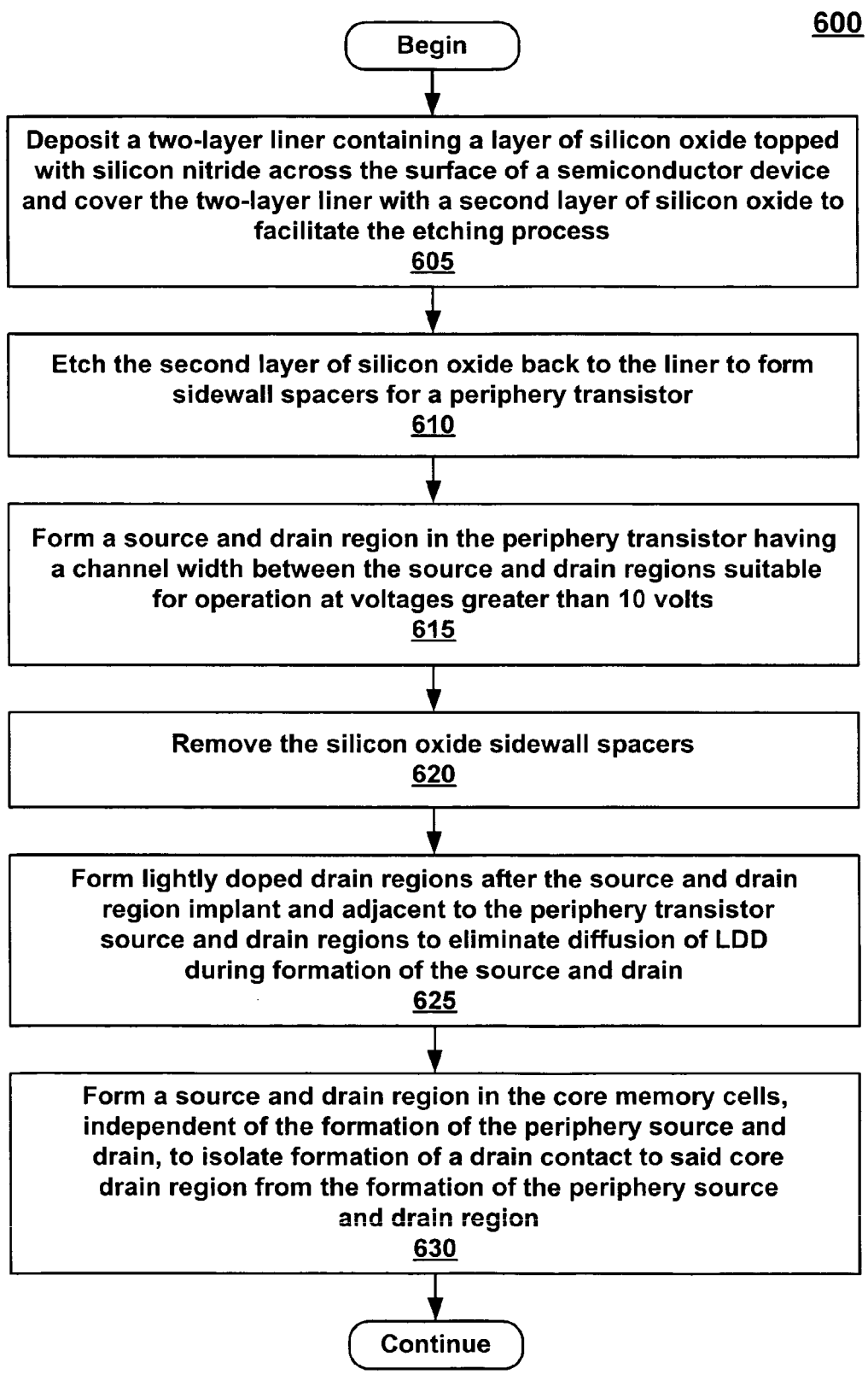
FIG. 6 is a flow diagram, in accordance with one embodiment of the present invention, of a method for fabricating semiconductor device.

FIG. 6 is a flow diagram of the steps performed in a method 700 for fabricating a semiconductor device, in accordance with one embodiment of the present invention. FIGS. 6A, 6B and 6C will be referenced for illustrations in the discussion that follows with respect to FIG. 6. At step 605, the present embodiment deposits across the surface of a semiconductor device (e.g., semiconductor device 500a of FIG. 5A) a two-layer liner (525 and 325) containing a layer 325 of silicon oxide (SiO) on top of which is deposited a layer 525 of silicon nitride (Silicon nitride). The Silicon nitride layer 525 is then topped with a deposition of a second layer 510 of silicon oxide that will form sidewall spacers 510 at periphery transistors 390 that had previously been formed on a substrate 355. In one embodiment, silicon oxide is selected at this step of the process for its etchability properties.

At step 610, the present embodiment etches the second layer 510 of silicon oxide back to the two-layer liner (525 and 325) to form sidewall spacers 510 of an appropriate width at periphery transistor 390. Appropriate width for the silicon oxide spacer 510 is one that allows for the implants to exhibit a channel width 307 that is suitable for operation at voltages in excess of 10 volts. Due to the need for higher voltages, a highly doped implant is used. In order to perform the highly doped n+/p+ implant, a wide sidewall spacer 510 is needed to avoid diffusion of the n+/p+ implant under the polysilicon gate region 315.

Referring now to step 615 of FIG. 6 in conjunction with FIGS. 3A–C, the present embodiment performs an n+/p+ implant to form a source 332 and drain 330 at the location of periphery transistors 390 suitable for operation at higher voltages, e.g., greater than 10 volts. Once the periphery transistor source region 332 and drain region 330 are implanted, a rapid thermal anneal (RTA) cycle is performed in order to activate the implants. By implanting the source region 332 and drain region 330 at the periphery transistor prior to and independent of implanting the lightly doped drain (LDD) regions 375 and the core memory cell source 370 and drain 380 regions, the present embodiment achieves two advantages. First, the periphery transistor sidewall spacers 310 may be sized without concern for how they might impact the formation of common source regions 387 and drain contact regions 382 at the core memory cells. Second, the later formation of the LDD and the core memory cell source and drain removes them from the RTA cycle associated with the periphery transistor source and drain implants. The advantage of experiencing fewer RTA cycles is that excessive thermal exposure that could result in diffusion of the source 370 and drain 380 regions under the polysilicon gate region is avoided. By avoiding this possible diffusion, current breakdown and/or short channel effects that could result in a change in threshold voltages and the semiconductor devices not meeting specification requirements are thus avoided.

At step 620, the present embodiment removes the silicon oxide sidewall spacers 510. The spacers 510 need to be removed in order to deposit the LDD implants after depositing the source and drain. The removal of sidewall spacers 510 also results in the removal of all or almost all of the silicon oxide layer 510 and the two-layer SiO/Silicon nitride liner at the common source area above source region 370 across the core memory cells.

In step 625 of FIG. 6, the present embodiment forms lightly doped drain (LDD) regions 375 adjacent to the source 332 and drain 330 regions in the periphery transistors 390. Once the silicon oxide 510 is etched back, the present embodiment implants the LDD regions (475) and performs an RTA cycle again to activate the LDD implants.

As shown in step 630 of FIG. 6, the present embodiment forms a source region 370 and drain region 380 at the core memory cells 395. The present embodiment performs another RTA cycle to activate the implantation. The present embodiment also deposits layer 385 of Silicon nitride to form sidewall spacers 385. Formation of sidewall spacers 385 allows space 382 to form a drain contact at the drain region 380 of core memory cells 395 and to fill the common source (Vss) region 387. It should be appreciated that any portion of the top layer 525 of the two-layer liner that might remain after the etching process will have little impact on the process since the sidewall spacers 385 and common source 387 are of the same material. Thus, the core memory cell source region 332 and drain region 330 may be fabricated so as to form appropriate drain contact areas independent of the formation of wide sidewall spacers at the periphery transistors. In so doing, the breakdown voltage level, or voltage at which current breakdown occurs, may be maintained in the periphery transistors.

While the methods of embodiments illustrated in flow charts 400 and 600 show specific sequences and quantities of steps, the present invention is suitable to alternative embodiments. For example, not all of the steps provided for in the method or methods are required for the present invention. Furthermore, additional steps may be added to the steps presented in the discussed embodiments. Likewise, the sequence of steps may be modified, depending upon the application.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A reverse LDD method for fabricating a semiconductor device, comprising:
   a) providing a substrate having a periphery transistor region and a core memory cell region;
   b) forming a first source region and a first drain region in said substrate of said periphery transistor region exhibiting a channel width between said first source region and said first drain region;
   c) forming lightly doped drain (LDD) regions adjacent to said first source region and said first drain region in said periphery transistor region;
   d) concurrently with said forming LDD regions, forming a second source region and a second drain region in said core memory cell region; and
   e) depositing a sidewall spacer over said LDD regions of said periphery transistor region, and said second source and drain regions of said core memory cell region; and
   f) limiting formation of said sidewall spacer to allow space for the formation of a drain contact to said second drain region said core memory cell region, thereby isolating said formation of said drain contact to said second source region of said core memory cell region.

2. The method as recited in claim 1 wherein said forming a first source region and a first drain region further comprises:
   b1) depositing a silicon oxide liner over said periphery transistor region and core memory cell region, wherein a periphery transistor in said periphery transistor region comprises a gate oxide layer formed on a semiconductor substrate between said first source region and said first drain region, and a polysilicon layer that is disposed on top of said gate oxide layer; and
   b2) depositing a silicon nitride layer disposed on top of said silicon oxide liner; and
   b3) forming said sidewall spacer wide enough to form said channel width between said first source region and said first drain region.

3. The method as recited in claim 2 wherein said depositing a silicon nitride layer further comprises:
   wherein said silicon nitride layer fills regions between core memory cells in said core memory cell region preventing formation of said second source region and said second drain region.

4. The method as recited in claim 1 wherein a core memory cell in said core memory cell region is a flash memory cell comprising:
   a tunnel oxide layer formed on a semiconductor substrate between said second source and said second drain regions;
   a floating gate formed on said tunnel oxide layer;
   a multi-level insulating layer formed on said floating gate; and
   a control gate formed on said insulating layer.

5. The method as recited in claim 2 wherein said forming a second source region and a second drain region comprises:
   removing said silicon nitride layer;
   forming said LDD regions in said periphery transistor region;
   concurrently forming said second source region and said second drain region; and
   activating said second source and said second drain regions by performing a first rapid thermal anneal cycle.

6. The method as recited in claim 5 wherein said second source and drain regions are exposed to a single RTA cycle.

7. The method as recited in claim 1 wherein said forming said first source region and said first drain region further comprises:
   depositing a silicon oxide liner over said periphery transistor, on top of which is deposited a layer of silicon nitride, said layer of silicon nitride along with said silicon oxide liner forming a two-layer liner;
   depositing a silicon oxide layer disposed on top of said two-layer liner; and
   forming said sidewall spacer with sufficient width to form said channel width between said first source region and said first drain region.

8. The method as recited in claim 7 further comprising:
   performing a rapid thermal anneal cycle; and
   removing said sidewall spacer.

9. A method for fabricating a source, drain and LDD in a semiconductor device, comprising:
   a) depositing a silicon oxide liner across a plurality of periphery transistors and a plurality of core memory cells formed on a substrate;
   b) depositing a silicon nitride layer across said silicon oxide liner to form first sidewall spacers on said plurality of periphery transistors, wherein said silicon nitride layer fills regions between core memory cells in said plurality of core memory cells preventing formation of second source regions and said second drain regions in said plurality of core memory cells;
   c) doping first source regions and first drain regions in said plurality of periphery transistors prior to performing a lightly doped drain implant;
   d) removing said first sidewall spacers;
   e) performing said lightly doped drain LDD implant in said plurality of periphery transistors to form LDD regions in said plurality of periphery transistors;
   f) concurrently with said performing said LDD implant, doping said second source regions and said second drain regions in said plurality of core memory cells;
   g) performing a minimum number of rapid thermal anneal cycles; and
   h) depositing a layer of silicon nitride to form a second sidewall spacer over said LDD regions of said plurality of periphery transistors, said second source and drain regions of said plurality of core memory cells, wherein formation of said second sidewall spacer is limited to allow space for the formation of drain contacts to at least one of said second drain regions of said plurality of periphery transistors, thereby isolating said formation of said drain contact to said second source region of said plurality of core memory cells.

10. The method as described in claim 9 wherein said plurality of core memory cells are flash memory cells comprising:
    a tunnel oxide layer formed on a semiconductor substrate between said second source and drain regions;
    a floating gate formed on said tunnel oxide layer;
    a multi-level insulating layer formed on said floating gate; and
    a control gate formed on said insulating layer.

11. A method for fabricating a semiconductor device, comprising:
    a) depositing a two-layer liner comprised of a first layer of silicon oxide topped with silicon nitride across the surface of said semiconductor device, said two-layer liner covered by a second layer of silicon oxide;

b) forming a sidewall spacer for a periphery transistor said sidewall spacer fills regions around a core memory cell preventing formation of a second source region and a second drain region in said core memory cell;

c) forming a first source region and a first drain region in said periphery transistor exhibiting a channel width between said first source and drain regions;

d) removing said sidewall spacer and forming lightly doped drain (LDD) regions adjacent to said first source and drain regions; and e) concurrently with said forming LDD regions, forming said second source region and said second drain region in said core memory cell;

f) depositing another layer of silicon nitride to form a second sidewall spacer over said LDD regions of said periphery transistor, said second source and drain regions of said core memory cell, wherein formation of said second sidewall spacer is limited to allow space for the formation of a drain contact to said second drain region of said periphery transistor, thereby isolating said formation of said drain contact to said second source region of said plurality of core memory cell.

12. The method as recited in claim 11 wherein said silicon nitride of said a) is for the purpose of protecting said layer of silicon oxide during said removing.

13. The method as recited in claim 11 wherein said core memory cell is a flash memory cell comprising:
    a tunnel oxide layer formed on a semiconductor substrate between said second source and drain regions;
    a floating gate formed on said tunnel oxide layer;
    a multi-level insulating layer formed on said floating gate; and
    a control gate formed on said insulating layer.

14. The method as recited in claim 11 wherein said e) comprises:
    activating said second source and drain regions by performing a first rapid thermal anneal (RTA) cycle.

15. The method as recited in claim 14 wherein said second source and drain regions are exposed to a single RTA cycle.

16. The method as recited in claim 11 wherein said forming said second source region and said second drain region comprises:
    e1) forming a common source coupled to said second source region.

* * * * *